United States Patent
Wei et al.

(10) Patent No.: US 10,374,579 B2
(45) Date of Patent: Aug. 6, 2019

(54) METHOD OF TWO-STAGE FRM FILTER

(71) Applicant: SHANDONG UNIVERSITY, Jinan, Shandong (CN)

(72) Inventors: Ying Wei, Jinan (CN); Shaoguang Huang, Jinan (CN)

(73) Assignee: SHANDONG UNIVERSITY, Jinan (CN)

(*) Notice: Subject to any disclaimer, the term of this patent is extended or adjusted under 35 U.S.C. 154(b) by 0 days.

(21) Appl. No.: 15/320,251

(22) PCT Filed: Jun. 19, 2014

(86) PCT No.: PCT/CN2014/080316
§ 371 (c)(1),
(2) Date: Dec. 19, 2016

(87) PCT Pub. No.: WO2015/184657
PCT Pub. Date: Dec. 10, 2015

(65) Prior Publication Data
US 2017/0149416 A1 May 25, 2017

(30) Foreign Application Priority Data
Jun. 5, 2014 (CN) .......................... 2014 1 0247784

(51) Int. Cl.
*H03H 17/02* (2006.01)
*H03H 17/06* (2006.01)

(52) U.S. Cl.
CPC ............ *H03H 17/02* (2013.01); *H03H 17/06* (2013.01)

(58) Field of Classification Search
None
See application file for complete search history.

(56) References Cited

FOREIGN PATENT DOCUMENTS

| CN | 101651463 A | 2/2010 |
|---|---|---|
| EA | 200501671 A2 | 6/2006 |

OTHER PUBLICATIONS

Wang, "Low Complexity FIR Filter Design Based on FRM Technique," China Master's Thesis Full-Text Database, 2007, pp. 1-51.
Huang, Hanhua, "Design of Wideband Filters by Frequency Response Masking Approach," Modern Electronics Technique, 2006, vol. 23, pp. 75-76.

(Continued)

Primary Examiner — Michael D. Yaary
(74) Attorney, Agent, or Firm — Oliff PLC

(57) ABSTRACT

An improved design method of a two-stage FRM filter includes the following steps: constructing an improved two-stage FRM filter; calculating passband and stopband edge parameters of a prototype filter, passband and stopband edge parameters of a second-stage masking filter and passband and stopband edge parameters of a first-stage masking filter in Case A and Case B, respectively; calculating the complexity of the FRM filter according to the obtained parameters, and finding out one or more sets [M, P, Q] having the lowest complexity within a search range; and optimizing the improved FRM filter. The improved design method of a two-stage FRM filter has the following beneficial effect: as compared to a conventional design method of a two-stage FRM filter, the complexity of a narrow-band FIR (Finite Impulse Response) filter can be reduced through design using the improved method, and power consumption is thus reduced in hardware implementation.

10 Claims, 3 Drawing Sheets

(56) References Cited

OTHER PUBLICATIONS

Wang et al., "FIR Digital Filter Design Using Transition Band Compensation Method," Journal of Data Acquisition & Processing, Dec. 2007, vol. 22, No. 4, pp. 511-514.

Hu et al., "Designing Uniform and Nonuniform Cosine modulated Filter Banks Using the Frequency Response Masking Approach," Modern Electronics Technique, vol. 10, 2007, pp. 35-38.

Cheng et al., "Time Domain Optimization Method Based on FRM Technique for Cosine Modulated Filter Banks," Journal of Telemetry, Tracking and Command, 2011, vol. 32, No. 4, pp. 47-54.

Mar. 3, 2015 International Search Report issued in International Patent Application No. PCT/CN2014/080316.

METHOD OF TWO-STAGE FRM FILTER

FIELD OF THE INVENTION

The present invention relates to an improved design method of a two-stage FRM filter.

BACKGROUND OF THE INVENTION

Frequency response masking (FRM) is an efficient method for designing an FIR (Finite Impulse Response) filter having a narrow transition band characteristic. When a filter has a narrow transition band, multi-stage FRM may be utilized to further reduce its complexity.

A filter is composed of a prototype filter $H_a(z)$ and two masking filters $H_{ma}(z)$, $H_{mc}(z)$. The transition band of the filter is provided by an interpolation filter $H_a(z^M)$ or its complement $$\left(z^{-\frac{M(N_a-1)}{2}} - H_a(z^M)\right)$$

where M is an interpolation factor for $H_a(z)$. The purpose of using two masking filters $H_{ma}(z)$ and $H_{mc}(z)$ is to remove unnecessary periodic sub-bands.

Two-stage FRM filters are widely used in practice. The structure of a two-stage FRM filter is as shown in FIG. 2. A transition band shaping filter is represented by G(z). A constraint condition for interpolation factors M, P, Q is as follows:

$$M=kP=kQ \qquad (3).$$

At present, various improvements made to the two-stage FRM filters are based on the assumption of the equation (3). The satisfaction of the equation (3) leads to a direct problem that the second-stage output must be a periodic amplitude response. However, the second-stage output does not have to be periodic as long as it provides a desired transition band for a target filter. Therefore, the complexity of an FRM filter can be further reduced if the values of the three factors can be found in a wider range.

SUMMARY OF THE INVENTION

The present invention aims at solving the above problem and provides an improved design method of a two-stage FRM filter.

In order to achieve the above objective, the present invention employs the following technical scheme.

An improved design method of a two-stage FRM filter comprises the following steps:

(1) constructing an improved two-stage FRM filter having a transfer function H(z) as follows:

$$H(z)=G(z)H_{ma}^{(1)}(z)+(1-G(z))H_{mc}^{(1)}(z),$$

wherein $G(z)=H_a^{(2)}(z^M)H_{ma}^{(2)}(z^P)+(1-H_a^{(2)}(z^M))H_{mc}^{(2)}(z^Q)$, without any constraint among interpolation factors M, P, Q;

$H_a^{(2)}(z^M)$ represents a prototype filter, while $H_{ma}^{(1)}(z)$ and $H_{mc}^{(1)}(z)$ represent first-stage masking filters, respectively, and $H_{ma}^{(2)}(z^P)$ and $H_{mc}^{(2)}(z^Q)$ represent second-stage masking filters, respectively;

(2) searching within a search range for [M, P, Q], and for a certain set [M, P, Q], calculating passband and stopband edge parameters of the prototype filter $H_a^{(2)}(z)$, passband and stopband edge parameters of the second-stage masking filters and passband and stopband edge parameters of the first-stage masking filters in Case A and Case B, respectively, on the basis that a transition band of the whole filter is provided by $H_a^{(2)}(z^M)$ or a complement of $H_a^{(2)}(z^M)$; and calculating the complexity of the FRM filter according to the obtained parameters, and finding out one or more sets [M, P, Q] having the lowest complexity within the search range;

(3) optimizing the improved FRM filter according to the calculated filter parameters. A way of calculating the passband edge $\theta_a$ and the stopband edge $\varphi_a$ of the prototype filter $H_a^{(2)}(z^M)$ in the step (2) is as follows:

when the transition band of the whole filter is $H_a^{(2)}(z^M)$, i.e., in the Case A:

$$m=\lfloor \omega_p M/2\pi \rfloor,$$

$$\theta_a=\omega_p M-2m\pi,$$

$$\varphi_a=\omega_s M-2m\pi;$$

when the transition band of the whole filter is the complement of $H_a^{(2)}(z^M)$, i.e., in the Case B:

$$m=\lceil \omega_s M/2\pi \rceil,$$

$$\theta_a=2m\pi-\omega_s M,$$

$$\varphi_a=2m\pi-\omega_p M;$$

wherein $\lfloor x \rfloor$ represents a largest integer not more than x; $\lceil x \rceil$ represents a smallest integer not less than x; whether the result satisfies $0<\theta_a<\varphi_a<\pi$ is determined in the two cases respectively, and if not, the results are abandoned.

Passbands of $H_a^{(2)}(M\omega)$ from 0 to $\pi$ in the step (2) are orderly represented by 0, 2, ..., $$2\times\left\lfloor \frac{M}{2} \right\rfloor,$$

and passbands of $1-H_a^{(2)}(M\omega)$ from 0 to it are orderly represented by 1, 3, ..., $$2\times\left\lfloor \frac{M-1}{2} \right\rfloor;$$

assuming that the passband labeled as 2m of $H_a^{(2)}(M\omega)$ provides the transition band, the passband of the masking filter from which the transition band is extracted is defined as an effective passband; and in order to reduce the complexity of the two first-stage masking filters, the following restrictive conditions are established:
the passband 2m should be at least completely extracted; the passband 2(m+1) should be completely fall outside an effective passband range.

When the transition band of the whole filter is provided by $H_a^{(2)}(z^M)$ i.e., in the Case A, a way of calculating the passband edge $\omega_{pma}^{(2)}$ and the stopband edge $\omega_{sma}^{(2)}$ of the second-stage masking filter $H_{ma}^{(2)}(z)$ is as follows:

(1) when masking is provided by $H_{ma}^{(2)}(z^P)$, the case is denoted as $\text{Case}_p=A$:

$$\begin{cases} \omega_{pma}^{(2)} = \max(2\pi p - \omega_1 P, \omega_2 P - 2\pi p) \\ \omega_{sma}^{(2)} = \omega_3 P - 2\pi p \end{cases};$$

(2) when masking is provided by the complement of $H_{ma}^{(2)}(z^P)$, the case is denoted as $Case_p=B$:

$$\begin{cases} \omega_{pma}^{(2)} = 2\pi p - \omega_2 P \\ \omega_{sma}^{(2)} = \min(\omega_1 P - 2\pi(p-1), 2\pi p - \omega_2 P) \end{cases};$$

wherein $\omega_1$ is a left edge of the passband 2m of the prototype filter, while $\omega_2$ is a right edge of the passband 2m of the prototype filter, and $\omega_3$ is a left edge of the passband 2(m+1) of the prototype filter; P is the interpolation factor, which is a given value;

p is an integer, and should satisfy the following condition:

$$0 \le p \le \left\lfloor \frac{P}{2} \right\rfloor;$$

if no p satisfying the condition exists, the set of parameters is abandoned.

When the transition band of the whole filter is provided by $H_a^{(2)}(z^M)$, i.e., in the Case A, a way of calculating the passband edge $\omega_{pmc}^{(2)}$ and the stopband edge $\omega_{smc}^{(2)}$ of the second-stage masking filter $H_{mc}^{(2)}(z)$ is as follows:

(1) when masking is provided by $H_{mc}^{(2)}(z^Q)$, the case is denoted as $Case_q=A$:

$$\begin{cases} \omega_{pmc}^{(2)} = \max(2\pi q - \omega_4 P, \omega_5 P - 2\pi q) \\ \omega_{smc}^{(2)} = \min(\omega_6 Q - 2\pi q, 2\pi(q+1) - \omega_7 Q) \end{cases};$$

(2) when masking is provided by the complement of $H_{mc}^{(2)}(z^Q)$, the case is denoted as $Case_q=B$:

$$\begin{cases} \omega_{pmc}^{(2)} = \max(2\pi q - \omega_6 Q, \omega_7 Q - 2\pi q) \\ \omega_{smc}^{(2)} = \min(\omega_4 Q - 2\pi(q-1), 2\pi q - \omega_5 Q) \end{cases};$$

wherein $\omega_4$ is a left passband edge of the complementary filter passband 2m−1 of the prototype filter; $\omega_5$ is a right stopband edge of the complementary filter passband 2m−1 of the prototype filter; $\omega_6$ is a left passband edge of the complementary filter passband 2m+1 of the prototype filter; $\omega_7$ is a right stopband edge of the complementary filter passband 2m+1 of the prototype filter; q is an integer, and should satisfy the following condition:

$$0 \le q \le \left\lfloor \frac{q}{2} \right\rfloor;$$

if no q satisfying the condition exists, the set of parameters is abandoned.

When the transition band of the whole filter is provided by the complement of $H_a^{(2)}(z^M)$, i.e., in the Case B, a way of calculating the passband edge $\omega_{pma}^{(2)}$ and the stopband edge $\omega_{sma}^{(2)}$ of the second-stage masking filter $H_{ma}^{(2)}(z)$ is as follows:

(1) when masking is provided by $H_{ma}^{(2)}(z^P)$ the case is denoted as $Case_p=A$:

$$\begin{cases} \omega_{pma}^{(2)} = \max(2\pi p - P\omega_4, \omega_5 P - 2\pi p) \\ \omega_{sma}^{(2)} = \min(\omega_6 P - 2\pi p, 2\pi(p+1) - \omega_7 P) \end{cases};$$

(2) when masking is provided by the complement of $H_{ma}^{(2)}(z^P)$ the case is denoted as $Case_p=B$:

$$\begin{cases} \omega_{pma}^{(2)} = \max(2\pi p - \omega_6 P, \omega_7 P - 2\pi p) \\ \omega_{sma}^{(2)} = \min(\omega_4 P - 2\pi(p-1), 2\pi p - \omega_5 P) \end{cases};$$

wherein $\omega_4$ is a left passband edge of the passband 2(m−1) of the prototype filter; $\omega_5$ is a right stopband edge of the passband 2(m−1) of the prototype filter; $\omega_6$ is a left passband edge of the passband 2m of the prototype filter; $\omega_7$ is a right stopband edge of the passband 2m of the prototype filter;

p is an integer, and should satisfy the following condition:

$$0 \le p \le \left\lfloor \frac{P}{2} \right\rfloor;$$

if no p satisfying the condition exists, the set of parameters is abandoned.

When the transition band of the whole filter is provided by the complement of $H_a^{(2)}(z^M)$, i.e., in the Case B, a way of calculating the passband edge $\omega_{pmc}^{(2)}$ and the stopband edge $\omega_{smc}^{(2)}$ of the second-stage masking filter $H_{mc}^{(2)}(z)$ is as follows:

(1) when masking is provided by $H_{mc}^{(2)}(z^Q)$, the case is denoted as $Case_q=A$:

$$\begin{cases} \omega_{pma}^{(2)} = \max(2\pi q - \omega_1 Q, \omega_2 Q - 2\pi q) \\ \omega_{sma}^{(2)} = \omega_2 Q - 2\pi q \end{cases};$$

(2) when masking is provided by the complement of $H_{mc}^{(2)}(z^Q)$, the case is denoted as $Case_q=B$:

$$\begin{cases} \omega_{pmc}^{(2)} = 2\pi q - \omega_2 Q \\ \omega_{smc}^{(2)} = \min(\omega_1 Q - 2\pi(q-1), 2\pi q - \omega_2 Q) \end{cases};$$

wherein $\omega_1$ is a left stopband edge of the complementary filter passband 2m−1 of the prototype filter; $\omega_2$ is a right passband edge of the complementary filter passband 2m−1 of the prototype filter; $\omega_3$ is a left stopband edge of the complementary filter passband 2m+1 of the prototype filter; q is an integer, and should satisfy the following condition:

$$0 \le q \le \left\lfloor \frac{q}{2} \right\rfloor;$$

if no q satisfying the condition exists, the set of parameters is abandoned.

When the transition band of the whole filter is provided by $H_a^{(2)}(z^M)$, i.e., in the Case A:
the passband edge $\omega_{pma}^{(1)}$ of the first-stage masking filter $H_{ma}^{(1)}(z)$ is equal to $\omega_p$; a way of calculating the stopband edge $\omega_{sma}^{(1)}$ of the first-stage masking filter $H_{ma}^{(1)}(z)$ is as follows:

$$\omega_{sma}^{(1)} = \min(\omega_{sma\_temp1}^{(1)}, \omega_{sma\_temp2}^{(1)}),$$

wherein $$\omega_{sma\_temp1}^{(1)} = \begin{cases} t_1 & t_1 \notin R_{stop}(k) \\ \omega_8 & t_1 \in R_{stop}(k_1) \end{cases},$$

$$\omega_{sma\_temp2}^{(1)} = \begin{cases} t_2 & t_2 \notin R_{pass}(k) \\ \omega_9 & t_2 \in R_{pass}(k_2) \end{cases},$$

$$\omega_8 = (2\pi k_1 = \varphi_a)/M; \omega_9 = (2\pi k_2 - \theta_a)/M;$$

$$R_{pass}(k) = \left[\frac{2\pi k - \theta_a}{M}, \frac{2\pi k + \theta_a}{M}\right], k = 0, \ldots, \lfloor M/2 \rfloor;$$

$$R_{stop}(k) = \left[\frac{2\pi(k-1)+\varphi_a}{M}, \frac{2\pi k + \varphi_a}{M}\right], k = 0, \ldots, \lfloor M/2 \rfloor;$$

(1) when $H_{ma}^{(2)}(z^P)$ is used for masking unnecessary band of an up-branch, $$t_1 = (2\pi(p+1) - \omega_{sma}^{(2)})/P;$$

(2) when the complement of $H_{ma}^{(2)}(z^P)$ is used for masking the unnecessary band of the up-branch, $$t_1 = (2\pi p + \omega_{pma}^{(2)})/P;$$

(3) when $H_{mc}^{(2)}(z^Q)$ is used for masking unnecessary band of a down-branch, $$t_2 = (2\pi(q+1) - \omega_{smc}^{(2)})/Q;$$

(4) when a down-branch complement of $H_{mc}^{(2)}(z^Q)$ is used for masking unnecessary band, $$t_2 = (2\pi q + \omega_{pmc}^{(2)})/Q;$$

wherein P, Q, M are interpolation factors; $\omega_8$ is a right endpoint of $R_{stop}(k_1)$; $k_1$ is an integer satisfying $t_1 \in R_{stop}(k_1)$; $\omega_9$ is a right endpoint of $R_{pass}(k_2)$; $k_2$ is an integer satisfying $t_2 \in R_{stop}(k_2)$; $\theta_a$ is a passband edge of $H_a^{(2)}(z)$; $H_{ma}^{(1)}(z) \varphi_a$ is a stopband edge of $H_a^{(2)}(z)$.

When the transition band of the whole filter is provided by the complement of $H_a^{(2)}(z^M)$, i.e., in the Case B:
the passband edge $\omega_{pma}^{(1)}$ of the first-stage masking filter $H_{ma}^{(1)}(z)$ is equal to $\omega_p$;
a way of calculating the stopband edge $\omega_{sma}^{(1)}$ of the first-stage masking filter $H_{ma}^{(1)}(z)$ is as follows:

$$\omega_{sma}^{(1)} = \min(\omega_{sma\_temp1}^{(1)}, \omega_{sma\_temp2}^{(1)}),$$

wherein $$\omega_{sma\_temp1}^{(1)} = \begin{cases} t_1 & t_1 \notin R_{stop}(k) \\ \omega_8 & t_1 \in R_{stop}(k_1) \end{cases},$$

$$\omega_{sma\_temp2}^{(1)} = \begin{cases} t_2 & t_2 \notin R_{pass}(k) \\ \omega_9 & t_2 \in R_{pass}(k_2) \end{cases},$$

$$\omega_8 = (2\pi k_1 = \theta_a)/M; \omega_9 = (2\pi k_2 - \varphi_a)/M;$$

$$R_{pass}(k) = \left[\frac{2\pi k - \theta_a}{M}, \frac{2\pi k + \theta_a}{M}\right], k = 0, \ldots, \lfloor M/2 \rfloor;$$

$$R_{stop}(k) = \left[\frac{2\pi(k-1)+\varphi_a}{M}, \frac{2\pi k + \varphi_a}{M}\right], k = 0, \ldots, \lfloor M/2 \rfloor;$$

(1) when $H_{mc}^{(2)}(z^Q)$ is used for masking unnecessary band, $$t_1 = (2\pi(q+1) - \omega_{smc}^{(2)})/Q;$$

(2) when the complement of $H_{mc}^{(2)}(z^Q)$ is used for masking unnecessary band, $$t_1 = (2\pi q + \omega_{pmc}^{(2)})/Q;$$

(3) when $H_{ma}^{(2)}(z^P)$ is used for masking unnecessary band, $$t_2 = (2\pi(p+1) - \omega_{sma}^{(2)})/P;$$

(4) when the complement of $H_{ma}^{(2)}(z^P)$ is used for masking unnecessary band, $$t_2 = (2\pi p + \omega_{pma}^{(2)})/P;$$

wherein $\omega_8$ is a right endpoint of $R_{stop}(k_1)$; $k_1$ is an integer satisfying $t_1 \in R_{stop}(k_1)$; $\omega_9$ is a right endpoint of $R_{pass}(k_2)$; $k_2$ is an integer satisfying $t_2 \in R_{stop}(k_2)$; P, Q, M are interpolation factors; $\theta_a$ is a passband edge of $H_a^{(2)}(z)$; $H_{ma}^{(1)}(z) \varphi_a$ is a stopband edge of $H_a^{(2)}(z)$.

(1) When the transition band of the whole filter is provided by $H_a^{(2)}(z^M)$, i.e., in the Case A:
the stopband edge $\omega_{smc}^{(1)}$ of the first-stage masking filter $H_{mc}^{(1)}(z)$ is equal to $\omega_s$;
a way of determining the passband edge $\omega_{pmc}^{(1)}$ of the first-stage masking filter $H_{mc}^{(1)}(z)$ is as follows:
if $t_3 \geq t_4$, then $$\omega_{pmc}^{(1)} = \begin{cases} t_3 & t_3 \notin R_{stop}(k) \\ \max\left(\frac{2\pi(k_3-1)+\varphi_a}{M}, t_4\right) & t_3 \in R_{stop}(k_3) \end{cases};$$

if $t_3 < t_4$, then $$\omega_{pmc}^{(1)} = \begin{cases} t_4 & t_4 \notin R_{pass}(k) \\ \max\left(\frac{2\pi k_4 - \theta_a}{M}, t_3\right) & t_4 \in R_{pass}(k_4) \end{cases};$$

(a) when $H_{ma}^{(2)}(z^P)$ is used for masking unnecessary band, $$t_3 = (2\pi p - \omega_{pma}^{(2)})/P;$$

(b) when the complement of $H_{ma}^{(2)}(z^P)$ is used for masking the unnecessary band, $$t_3 = (2\pi(p-1) + \omega_{sma}^{(2)})/P;$$

(c) when $H_{mc}^{(2)}(z^Q)$ is used for masking unnecessary band, $$t_4 = (2\pi q - \omega_{pmc}^{(2)})/Q;$$

(d) when the complement $H_{mc}^{(2)}(z^Q)$ is used for masking unnecessary band, $$t_4 = (2\pi(q-1) + \omega_{smc}^{(2)})/Q;$$

(2) when the transition band of the whole filter is provided by the complement of $H_a^{(2)}(z^M)$, i.e., in the Case B:
the stopband edge $\omega_{smc}^{(1)}$ of the first-stage masking filter $H_{mc}^{(1)}(z)$ is equal to $\omega_s$;
a way of determining the passband edge $\omega_{pmc}^{(1)}$ of the first-stage masking filter $H_{mc}^{(1)}(z)$ is as follows:
if $t_3 \geq t_4$, then $$\omega_{pmc}^{(1)} = \begin{cases} t_3 & t_3 \notin R_{stop}(k) \\ \max\left(\frac{2\pi(k_3-1)+\varphi_a}{M}, t_4\right) & t_3 \in R_{stop}(k_3) \end{cases};$$

if $t_3 < t_4$, then $$\omega_{pmc}^{(1)} = \begin{cases} t_4 & t_4 \notin R_{pass}(k) \\ \max\left(\dfrac{2\pi k_4 - \theta_a}{M}, t_3\right) & t_4 \in R_{pass}(k_4) \end{cases};$$

(a) when $H_{mc}^{(2)}(z^Q)$ is used for masking unnecessary band, $$t_3 = (2\pi(q-1) + \omega_{smc}^{(2)})/Q;$$

(b) when the complement of $H_{mc}^{(2)}(z^Q)$ is used for masking the unnecessary band, $$t_3 = (2\pi(q-1) + \omega_{smc}^{(2)})/Q;$$

(c) when $H_{ma}^{(2)}(z^P)$ is used for masking unnecessary band, $$t_4 = (2\pi(p-1) + \omega_{sma}^{(2)})/P;$$

(d) when the complement $H_{ma}^{(2)}(z^P)$ is used for masking unnecessary band, $$t_4 = (2\pi(p-1) + \omega_{sma}^{(2)})/P;$$

wherein $t_3$ and $t_4$ are left passband edges of the passband including the transition band and a first passband on the left of the transition band, respectively; $k_3$ is an integer satisfying $t_3 \in R_{stop}(k_3)$; $k_4$ is an integer satisfying $t_4 \in R_{pass}(k_4)$; P, Q, M are interpolation factors; $\theta_a$ is a passband edge of $H_a^{(2)}(z)$; $H_{ma}^{(1)}(z)\varphi_a$ is a stopband edge of $H_a^{(2)}(z)$.

The present invention has the following beneficial effects: according to the present invention, the restriction that the interpolation factors must satisfy the constraint condition M=kP=kQ in a conventional structure is broken by constructing an improved two-stage FRM filter structure, and the subfilters are optimized simultaneously by means of a nonlinear joint optimization method. Results indicate that, as compared to a conventional design method of a two-stage FRM filter, the complexity of a narrow-band FIR (Finite Impulse Response) filter can be reduced through design using the improved method, and power consumption is thus reduced in hardware implementation.

DETAILED DESCRIPTION OF THE EMBODIMENTS

The present invention will be further illustrated below in combination with the accompanying drawings and embodiment.

Figure 1:
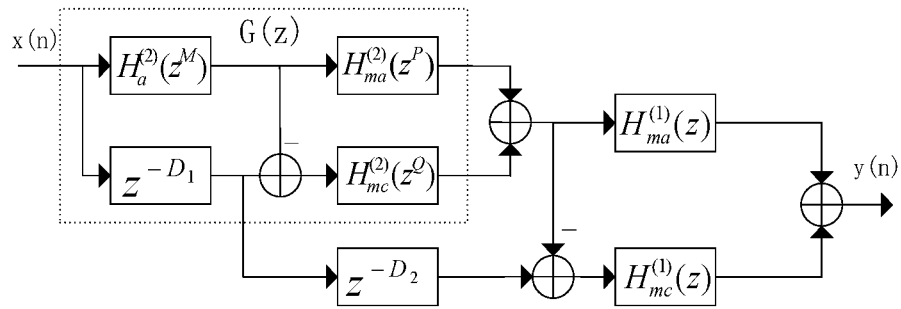
FIG. 1 is a structural schematic diagram of an improved two-stage FRM filter of the present invention.

The structure of an improved two-stage FRM filter is as shown in FIG. 1 in which M, P, Q are interpolation factors. A transfer function H(z) of the filter is expressed as the following formula:

$$H(z) = G(z)H_{ma}^{(1)}(z) + (1 - G(z))H_{mc}^{(1)}(z), \quad (4)$$

$$G(z) = H_a^{(2)}(z^M)H_{ma}^{(2)}(z^P) + (1 - H_a^{(2)}(z^M))H_{mc}^{(2)}(z^Q), \quad (5)$$

Figure 2:
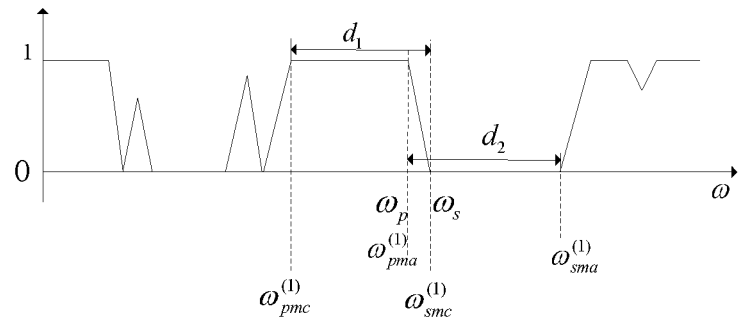
FIG. 2 is an amplitude response possibly existing in G(z) of the present invention.

Z-transformation transfer function of G(z) is expressed as the formula (5), and the possible amplitude response existing therein is as shown in FIG. 2 in which $\omega_p$ and $\omega_s$ represent a passband edge and a stopband edge of the designed filter, respectively. It should be noted that the amplitude response of G(z) may be not periodic because of no any constraint among the interpolation factors M, P, Q. The passband and stopband edges $\omega_{pma}^{(1)}$ and $\omega_{sma}^{(1)}$ of a filter $H_{ma}^{(1)}(z)$ are as shown in FIG. 2. A distance between $\omega_{pma}^{(1)}$ and $\omega_{sma}^{(1)}$ is indicated by $d_1$, and a distance between $\omega_{pma}^{(1)}$ and $\omega_{sma}^{(1)}$ is indicated by $d_2$.

It is assumed that the passband ripple and the stopband ripple of the filter are represented by $\delta_p$ and $\delta_s$, respectively. Since a conventional calculation way cannot be used to determine the passband and stopband edges of each subfilter, a new way is required to obtain them.

The transition band of the whole filter may be formed by $H_a^{(2)}(z^M)$ or its complement, and therefore, there are two cases: Case A and Case B. In the Case A, the transition band of the filter is provided by $H_a^{(2)}(z^M)$; in the Case B, the transition band of the filter is provided by the complement of $H_a^{(2)}(z^M)$. Besides, masking may be achieved by $H_{ma}^{(2)}(z^P)$ and $H_{mc}^{(2)}(z^Q)$ or their complements. The following two parameters are defined to distinguish the above cases:
when $H_{ma}^{(2)}(z^P)$ is used, $Case_p = A$, and when $H_{ma}^{(2)}(z^P)$ is used, $Case_q = A$;
when the complement of $H_{ma}^{(2)}(z^P)$ is used, $Case_p = B$, and when the complement of $H_{ma}^{(2)}(z^P)$ is used, $Case_q = B$.

Depending on the positions of the passband and stopband edges, there exist multiple cases for the improved structure. Now, it is first to focus on the design in Case A since Case A and Case B are similar. A set of interpolation factors [M, P, Q] leading to the lowest complexity of the filter may be found out through global search, and the complexity is decided by the number of multipliers. For the given M, P and Q, illustration will be made on how the parameters of these subfilters are determined below.

I. Calculation of the passband and stopband edges of a prototype filter $H_a^{(2)}(z)$ The passband and stopband edges of the prototype filter $H_a^{(2)}(z)$ are determined by a conventional way. The $H_a^{(2)}(z)$ passband edge $\theta_a$ and the stopband edge $\varphi_a$ of $H_a^{(2)}(z)$ are obtained readily:

For Case A, $$m = \lfloor \omega_p M / 2\pi \rfloor, \quad (6a)$$

$$\theta_a = \omega_p M - 2m\pi, \quad (6b)$$

$$\varphi_a = \omega_s M - 2m\pi. \quad (6c);$$

For the Case B, $$m = \lceil \omega_s M / 2\pi \rceil, \quad (7a)$$

$$\theta_a = 2m\pi - \omega_s M, \quad (7b)$$

$$\varphi_a = 2m\pi - \omega_p M, \quad (7c)$$

wherein $\lfloor x \rfloor$ represents a largest integer not more than x. $\lceil x \rceil$ represents a smallest integer not less than x. whether the results satisfies $0 < \theta_a < \varphi_a < \pi$ is determined in the two cases respectively, and if not, the results are abandoned. The condition $0 < \theta_a < \varphi_a < \pi$ must be satisfied in both cases, and only one case meets the requirement.

II. Calculation of the passband and the stopband of second-stage masking filters The passband and stopband edges of $H_{ma}^{(2)}(z)$ and $H_{mc}^{(2)}(z)$ are represented by $\omega_{pma}^{(2)}$, $\omega_{sma}^{(2)}$, $\omega_{pmc}^{(2)}$, and $\omega_{smc}^{(2)}$, respectively. In addition, passbands of $H_a^{(2)}(M\omega)$ from 0 to $\pi$ in the step (2) are orderly represented by 0, 2, . . . , $$2 \times \left\lfloor \frac{M}{2} \right\rfloor,$$

and passbands of $1-H_a^{(2)}(M\omega)$ from 0 to $\pi$ are orderly represented by 1, 3, . . . , $$2 \times \left\lfloor \frac{M-1}{2} \right\rfloor.$$

1) Case A

Figure 3:
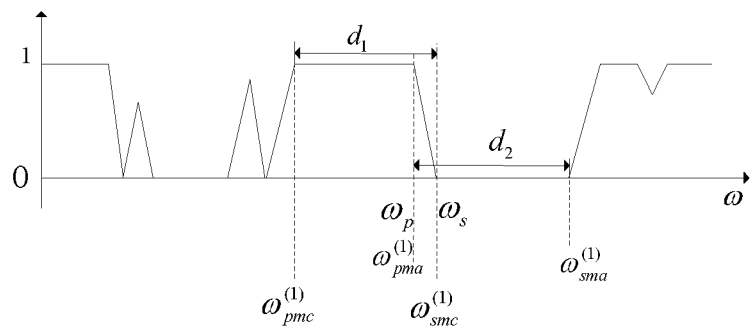
FIG. 3 is an amplitude response of an up-branch of G(z) of the present invention.

The amplitude response of the up-branch of G(z) is as shown in FIG. 3. Assuming that the passband labeled as 2m of $H_a^{(2)}(M\omega)$ provides the transition band, the passband of the masking filter from which the transition band is extracted is defined as an "effective passband". With reference to FIG. 3, a restrictive condition is established to prevent $d_1$ from being too small: the passband 2m should be at least completely extracted. In order to prevent $d_2$ from being too small: a restrictive condition is also established: the passband 2(m+1) should completely fall outside an effective passband range. The two constraint conditions may also be described as follows:

1) the left passband edge $x_1$ of the effective passband should not be greater than the left edge $\omega_1$ of the passband 2m;

2) the right passband edge $x_2$ of the effective passband should not be lower than the right edge $\omega_2$ of the passband 2m; $\omega_2$ 3) the right stopband edge $x_3$ of the effective passband should not be greater than the left edge $\omega_3$ of the passband 2(m+1).

Relevant inequations and variable values are as shown in Table I in which $$0 \le p \le \left\lfloor \frac{P}{2} \right\rfloor.$$

For the known set of interpolation factors [M, P, Q], if there exists p allowing $\omega_{pma}^{(2)}$ and $\omega_{sma}^{(2)}$ to satisfy the three in equations from (10a) to (10c), other filter parameters will be calculated continuously; or otherwise, this set of interpolation factors is abandoned. After the inequations are solved, upper and lower bounds of $\omega_{pma}^{(2)}$ and $\omega_{sma}^{(2)}$ may be obtained. The maximum of $\omega_{sma}^{(2)}$ and the minimum of $\omega_{pma}^{(2)}$ are taken, respectively, and then the transition band of the filter $H_{ma}^{(2)}(z)$ is the widest. The values of $\omega_{pma}^{(2)}$ and $\omega_{sma}^{(2)}$ are as follows:

For $\text{Case}_p=A$, $$\begin{cases} \omega_{pma}^{(2)} = \max(2\pi p - \omega_1 P, \omega_2 P - 2\pi p), \\ \omega_{sma}^{(2)} = \omega_3 P - 2\pi p \end{cases} \tag{8}$$

For $\text{Case}_p=B$, $$\begin{cases} \omega_{pma}^{(2)} = 2\pi p - \omega_3 P, \\ \omega_{sma}^{(2)} = \min(\omega_1 P - 2\pi(p-1), 2\pi p - \omega_2 P) \end{cases} \tag{9}$$

TABLE I

Variable Values And Inequations For Calculating The Passband And The Stopband Of $H_{ma}^{(2)}(z)$ In Case A

| Inequations | |
|---|---|
| $x_1 \le \omega_1 = \dfrac{2\pi m - \varphi_a}{M}$ | (10a) |
| $x_2 \ge \omega_2 = \omega_p$ | (10b) |
| $x_3 \le \omega_2 = \dfrac{2\pi(m+1) - \varphi_a}{M}$ | (10c) |
| $\text{Case}_p = A$ | |
| $x_1 = (2\pi p - \omega_{pma}^{(2)})/P$ | (11a) |
| $x_2 = (2\pi p + \omega_{pma}^{(2)})/P$ | (11b) |
| $x_3 = (2\pi p + \omega_{sma}^{(2)})/P$ | (11c) |
| $\text{Case}_p = B$ | |
| $x_1 = (2\pi(p-1) + \omega_{sma}^{(2)})/P$ | (12a) |
| $x_2 = (2\pi p - \omega_{sma}^{(2)})/P$ | (12b) |
| $x_3 = (2\pi p - \omega_{pma}^{(2)})/P$ | (12c) |

Figure 4:
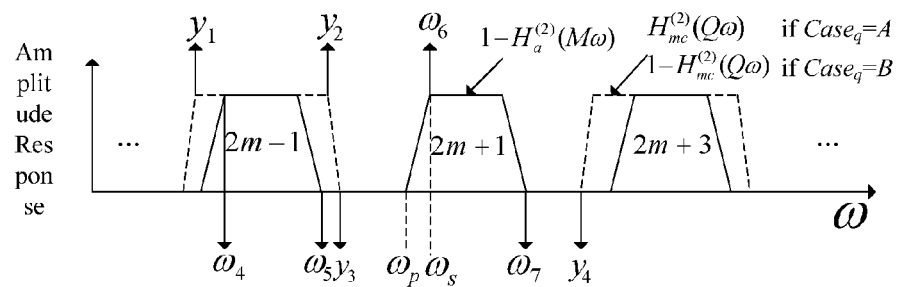
FIG. 4 is an amplitude response of a down-branch of G(z) of the present invention.

The passband and stopband edges of $H_{mc}^{(2)}(z)$ may be obtained similarly. The amplitude response of the down-branch of G(z) is as shown in FIG. 4. To prevent $d_1$ from being too small, the passband 2(m-1) is fully reserved. To prevent d from being too small, the passband (2m+1) is fully removed. Corresponding inequations and variable values are shown in Table II in which $$0 \le q \le \left\lfloor \frac{q}{2} \right\rfloor.$$

If there exists the parameter q allowing $\omega_{pmc}^{(2)}$ and $\omega_{smc}^{(2)}$ to satisfy the four in equations from (14a) to (14d), other filter parameters will be calculated continuously; or otherwise, this set of interpolation factors is abandoned. To make the transition band of $H_{mc}^{(2)}(z)$ widest, the maximum of $\omega_{smc}^{(2)}$ and the minimum of $\omega_{pmc}^{(2)}$ are taken, respectively.

For $\text{Case}_q=A$, $$\begin{cases} \omega_{pmc}^{(2)} = \max(2\pi q - \omega_4 Q, \omega_5 Q - 2\pi q), \\ \omega_{smc}^{(2)} = \min(\omega_6 Q - 2\pi q, 2\pi(q+1) - \omega_7 Q) \end{cases} \tag{12}$$

For $Case_q=B$, $$\begin{cases} \omega_{pmc}^{(2)} = \max(2\pi q - \omega_6 Q, \omega_7 Q - 2\pi q), \\ \omega_{smc}^{(2)} = \min(\omega_4 - 2\pi(q-1), 2\pi q - \omega_5 Q) \end{cases} \quad (13)$$

TABLE II

Variable Values And Inequations For Calculating The Passband And The Stopband Of $H_{ma}^{(2)}(z)$ In Case A

| Inequations | |
|---|---|
| $y_1 \leq \omega_4 = \dfrac{2\pi(m-1) + \varphi_a}{M}$ | (14a) |
| $y_2 \geq \omega_5 = \dfrac{2\pi m - \theta_a}{M}$ | (14b) |
| $y_3 \leq \omega_6 = \omega_s$ | (14c) |
| $y_4 \geq \omega_7 = \dfrac{2\pi(m+1) - \theta_a}{M}$ | (14d) |
| $Case_q = A$ | |
| $y_1 = (2\pi q - \omega_{pma}^{(2)})/Q$ | (15a) |
| $y_2 = (2\pi q + \omega_{pma}^{(2)})/Q$ | (15b) |
| $y_3 = (2\pi q + \omega_{ama}^{(2)})/Q$ | (15c) |
| $y_4 = (2\pi(q+1) - \omega_{ama}^{(2)})/Q$ | (15d) |
| $Case_q = B$ | |
| $y_1 = (2\pi(q-1) + \omega_{sma}^{(2)})/Q$ | (16a) |
| $y_2 = (2\pi q - \omega_{ama}^{(2)})/Q$ | (16b) |
| $y_3 = (2\pi q - \omega_{pma}^{(2)})/Q$ | (16c) |
| $y_4 = (2\pi q + \omega_{pma}^{(2)})/Q$ | (16d) |

2) Case B

For Case B, the transition band of $G(z)$ is formed by the complement of $H_a^{(2)}(z^M)$.

Determination of the passband and stopband edges of $H_{ma}^{(2)}(z)$ is similar to solving of the passband and stopband edges of $H_{mc}^{(2)}(z)$ in Case A. Corresponding inequations and parameters are as shown in Table III. The passband and stopband edges of $H_{ma}^{(2)}(z)$ are shown below:

For $Case_p=A$, $$\begin{cases} \omega_{pma}^{(2)} = \max(2\pi p - P\omega_4, \omega_5 P - 2\pi p), \\ \omega_{sma}^{(2)} = \min(\omega_6 P - 2\pi p, 2\pi(p+1) - \omega_7 P) \end{cases} \quad (17)$$

For $Case_p=B$, $$\begin{cases} \omega_{pma}^{(2)} = \max(2\pi p - \omega_6 P, \omega_7 P - 2\pi p), \\ \omega_{sma}^{(2)} = \min(\omega_4 P - 2\pi(p-1), 2\pi p - \omega_5 P) \end{cases} \quad (18)$$

TABLE III

Variable Values And Inequations For Calculating The Passband And The Stopband Of $H_{ma}^{(2)}(z)$ in Case B

| Inequations | |
|---|---|
| $y_1 \leq \omega_4 = \dfrac{2\pi(m-1) - \theta_a}{M}$ | (19a) |
| $y_2 \geq \omega_5 = \dfrac{2\pi(m-1) + \varphi_a}{M}$ | (19b) |
| $y_3 \leq \omega_6 = \omega_s$ | (19c) |
| $y_4 \geq \omega_7 = \dfrac{2\pi m + \varphi_a}{M}$ | (19d) |
| $Case_p = A$ | |
| $y_1 = (2\pi p - \omega_{pma}^{(2)})/P$ | (20a) |
| $y_2 = (2\pi p + \omega_{pma}^{(2)})/P$ | (20b) |
| $y_3 = (2\pi p + \omega_{sma}^{(2)})/P$ | (20c) |
| $y_4 = (2\pi(p+1) - \omega_{sma}^{(2)})/P$ | (20d) |
| $Case_p = B$ | |
| $y_1 = (2\pi(p-1) + \omega_{sma}^{(2)})/P$ | (21a) |
| $y_2 = (2\pi p - \omega_{sma}^{(2)})/P$ | (21b) |
| $y_3 = (2\pi p - \omega_{pma}^{(2)})/P$ | (21c) |
| $y_4 = (2\pi p + \omega_{pma}^{(2)})/P$ | (21d) |

Determination of the passband and stopband edges of $H_{mc}^{(2)}(z)$ is similar to the method of calculating the passband and stopband edges of $H_{ma}^{(2)}(z)$ in Case A. Corresponding inequations and parameters are shown in Table IV. The passband and stopband edges of $H_{mc}^{(2)}(z)$ are shown below:

For $Case_q=A$, $$\begin{cases} \omega_{pmc}^{(2)} = \max(2\pi q - \omega_1 Q, \omega_2 Q - 2\pi q), \\ \omega_{smc}^{(2)} = \omega_3 Q - 2\pi q \end{cases} \quad (22)$$

For $Case_q=B$, $$\begin{cases} \omega_{pmc}^{(2)} = 2\pi q - \omega_3 Q, \\ \omega_{smc}^{(2)} = \min(\omega_1 Q - 2\pi(q-1), 2\pi q - \omega_2 Q) \end{cases} \quad (23)$$

TABLE IV

Variable Values And Inequations For Calculating The Passband And The Stopband Of $H_{ma}^{(2)}(z)$ In Case B

| Inequations | |
|---|---|
| $x_1 \leq \omega_1 = \dfrac{2\pi(m-3) + \theta_a}{M}$ | (24a) |
| $x_2 \geq \omega_2 = \omega_s$ | (24b) |

TABLE IV-continued

Variable Values And Inequations For Calculating The Passband And The Stopband Of $H_{ma}^{(2)}(z)$ In Case B

| | |
|---|---|
| $x_3 \leq \omega_3 = \dfrac{2\pi m + \theta_a}{M}$ | (24c) |
| $\text{Case}_q = A$ | |
| $x_1 = (2\pi q - \omega_{pma}^{(2)})/Q$ | (25a) |
| $x_2 = (2\pi q + \omega_{pma}^{(2)})/Q$ | (25b) |
| $x_3 = (2\pi q + \omega_{sma}^{(2)})/Q$ | (25c) |
| $\text{Case}_q = B$ | |
| $x_1 = (2\pi(q-1) + \omega_{sma}^{(2)})/Q$ | (26a) |
| $x_2 = (2\pi q - \omega_{sma}^{(2)})/Q$ | (26b) |
| $x_3 = (2\pi q - \omega_{pma}^{(2)})/Q$ | (26c) |

Figure 5:
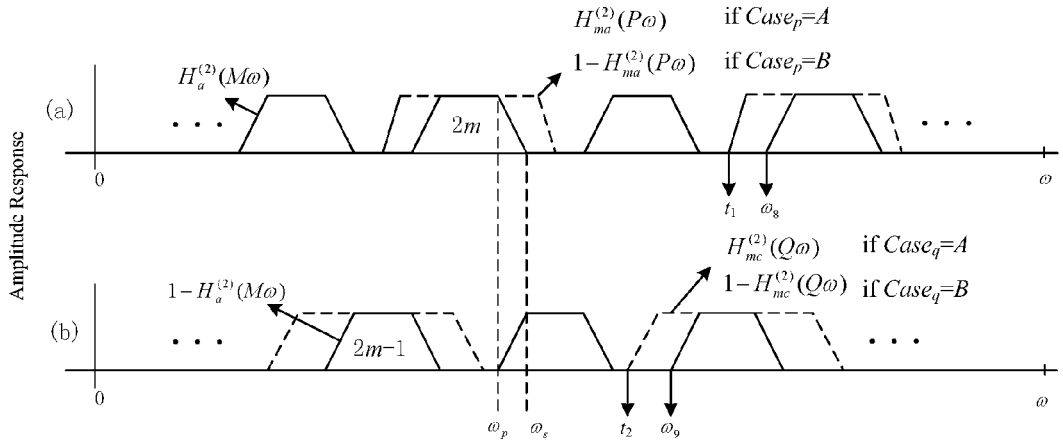
FIG. 5 is a schematic diagram of calculation of a stopband edge $\omega_{sma}^{(1)}$ in Case=A according to the present invention.

III. Calculation of the passband and stopband edges of first-stage masking filters 1) Case A For a masking filter $H_{ma}^{(1)}(z)$, since the transition band of $H(z)$ is provided by $H_a^{(2)}(z^M)$, its passband edge $\omega_{pma}^{(1)}$ is equal to $\omega_p$. Determination of the stopband edges $\omega_{sma}^{(1)}$, $\omega_{sma}^{(1)}$ is as shown in FIG. 5.

The stopband edge $\omega_{sma}^{(1)}$ is the right endpoint of $d_2$. Therefore, the first masking filter passband on the right of the transition band is focused. The left stopband cutoff points of the two passbands are denoted as $t_1$ and $t_2$. It is required to find out the position of $t_1$ in $H_a^{(2)}(M\omega)$ and the position of $t_2$ in $1-H_a^{(2)}(M\omega)$. The passband and stopband regions of $H_a^{(2)}(M\omega)$ may be obtained through the following formulas:

$$R_{pass}(k) = \left[\frac{2\pi k - \theta_a}{M}, \frac{2\pi k + \theta_a}{M}\right], k = 0, \ldots, \lfloor M/2 \rfloor, \quad (27)$$

$$R_{stop}(k) = \left[\frac{2\pi(k-1) + \varphi_a}{M}, \frac{2\pi k + \varphi_a}{M}\right], k = 0, \ldots, \lfloor M/2 \rfloor, \quad (28)$$

A temporary value of $\omega_{sma}^{(1)}$ is obtained according to the position of $t_1$, and denoted as $\omega_{sma\_temp1}^{(1)}$:

$$\omega_{sma\_temp1}^{(1)} = \begin{cases} t_1 & t_1 \notin R_{stop}(k) \\ \omega_8 & t_1 \in R_{stop}(k_1) \end{cases}, \quad (29)$$

wherein $\omega_8$ is the right endpoint of $R_{stop}(k_1)$, and $k_1$ is an integer satisfying $t_1 \in R_{stop}(k_1)$.

Another temporary value of $\omega_{sma}^{(1)}$ is obtained according to the position of $t_2$, and denoted as $\omega_{sma\_temp2}^{(1)}$:

$$\omega_{sma\_temp2}^{(1)} = \begin{cases} t_2 & t_2 \notin R_{pass}(k) \\ \omega_9 & t_2 \in R_{pass}(k_2) \end{cases}, \quad (30)$$

wherein $\omega_9$ is the right endpoint of $R_{pass}(k_2)$ and $k_2$ is an integer satisfying $t_2 \in R_{stop}(k_2)$.

The value of $\omega_{sma}^{(1)}$ is obtained through the following formula:

$$\omega_{sma}^{(1)} = \min(\omega_{sma\_temp1}^{(1)}, \omega_{sma\_temp2}^{(1)}), \quad (31)$$

wherein parameters $t_1$, $t_2$, $\omega_8$ and $\omega_9$ are as shown in Table V.

TABLE V

Variable Values For Calculating $\omega_{sma}^{(1)}$ in Case A

| | | |
|---|---|---|
| $\text{Case}_p = A$ | $t_1 = (2\pi(p+1) - \omega_{sma}^{(2)})/P$ | (32) |
| $\text{Case}_p = B$ | $t_1 = (2\pi p + \omega_{pma}^{(2)})/P$ | (33) |
| $\text{Case}_q = A$ | $t_2 = (2\pi(q+1) - \omega_{smc}^{(2)})/Q$ | (34) |
| $\text{Case}_q = B$ | $t_2 = (2\pi q + \omega_{pmc}^{(2)})/Q$ | (35) |
| | $\omega_8 = (2\pi k_1 - \varphi_a)/M$ | (36) |
| | $\omega_9 = (2\pi k_2 + \theta_a)/M$ | (37) |

Figure 6:
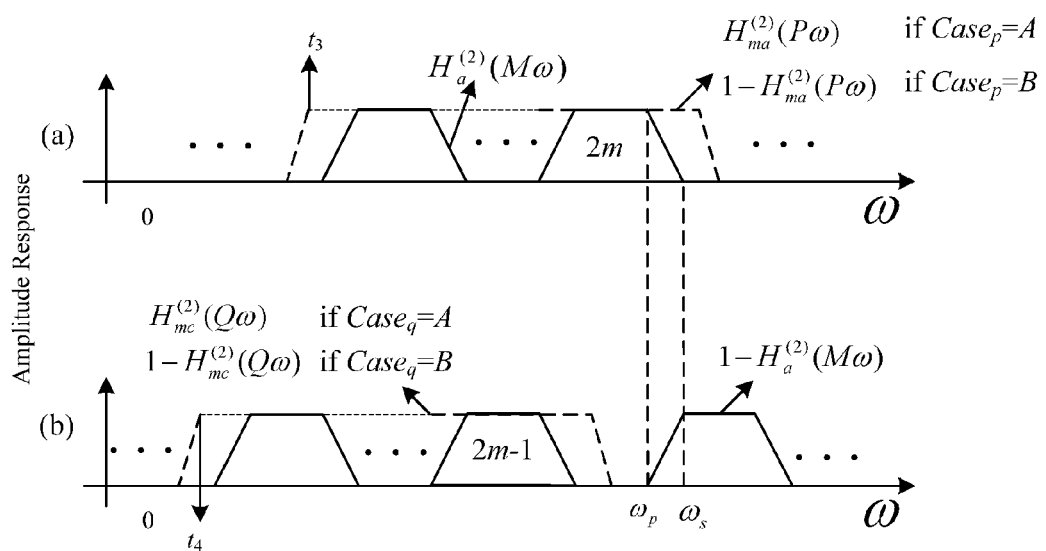
FIG. 6 is a schematic diagram of calculation of a passband edge $\omega_{pmc}^{(1)}$ in Case=A according to the present invention.

For a masking filter $H_{mc}^{(1)}(z)$, its stopband edge $\omega_{smc}^{(1)}$ is equal to $\omega_s$, and only its passband edge $\omega_{pmc}^{(1)}$ needs to be determined. Calculation of $\omega_{pmc}^{(1)}$ is as shown in FIG. 6. Since $\omega_{pmc}^{(1)}$ is the left endpoint of $d_1$, for $H_{ma}^{(2)}(P\omega)$, only the passband including the transition band is focused, and for $H_{mc}^{(2)}(Q\omega)$, only the first passband on the left of the transition band is focused. The left passband edges of the two passbands are defined as $t_3$ and $t_4$.

If $t_3 \geq t_4$, then $$\omega_{pmc}^{(1)} = \begin{cases} t_3 & t_3 \notin R_{stop}(k) \\ \max\left(\dfrac{2\pi(k_3-1)+\varphi_a}{M}, t_4\right) & t_3 \in R_{stop}(k_3) \end{cases}; \quad (38)$$

if $t_3 < t_4$, then $$\omega_{pmc}^{(1)} = \begin{cases} t_4 & t_4 \notin R_{pass}(k) \\ \max\left(\dfrac{2\pi k_4 - \theta_a}{M}, t_3\right) & t_4 \in R_{pass}(k_4) \end{cases}, \quad (39)$$

wherein the values of the parameters $t_3$ and $t_4$ are as shown in Table VI.

TABLE V

Variable Values For Calculating $\omega_{pmc}^{(1)}$ in Case A

| | | |
|---|---|---|
| $\text{Case}_p = A$ | $t_2 = (2\pi p - \omega_{pma}^{(2)})/P$ | (40) |
| $\text{Case}_p = B$ | $t_2 = (2\pi(p-1) + \omega_{sma}^{(2)})/P$ | (41) |
| $\text{Case}_q = A$ | $t_4 = (2\pi q - \omega_{pmc}^{(2)})/Q$ | (42) |
| $\text{Case}_q = B$ | $t_4 = (2\pi(q-1) + \omega_{smc}^{(2)})/Q$ | (43) |

2) Case B

In Case B, the ways of calculating $\omega_{sma}^{(1)}$ and $\omega_{pmc}^{(1)}$ are similar to those in Case A with corresponding parameters as shown in Table VII and Table VIII. It should be noted that the passband and stopband edges of all the subfilters must fall into the range from 0 to $\pi$; otherwise, the subsequent design of the set of interpolation factors [M, P, Q] is considered to be meaningless.

TABLE VII

Variable Values For Calculating $\omega_{sma}^{(1)}$ in Case B

| | | |
|---|---|---|
| $\text{Case}_p = A$ | $t_2 = (2\pi(p+1) - \omega_{sma}^{(2)})/P$ | 44) |
| $\text{Case}_p = B$ | $t_2 = (2\pi p + \omega_{pma}^{(2)})/P$ | (45) |

TABLE VII-continued

Variable Values For Calculating $\omega_{sma}^{(1)}$ in Case B

| | | |
|---|---|---|
| $Case_q = A$ | $t_1 = (2\pi(q+1) - \omega_{sma}^{(2)})/Q$ | (46) |
| $Case_q = B$ | $t_1 = (2\pi q + \omega_{pmc}^{(2)})/Q$ | (47) |
| | $\omega_8 = (2\pi k_1 + \theta_a)/M$ | (48) |
| | $\omega_9 = (2\pi k_2 - \varphi_a)/M$ | (49) |

TABLE VIII

Variable Values For Calculating $\omega_{pmc}^{(1)}$ in Case B

| | | |
|---|---|---|
| $Case_p = A$ | $t_4 = (2\pi p - \omega_{pma}^{(2)})/P$ | (50) |
| $Case_p = B$ | $t_4 = (2\pi(p-1) + \omega_{sma}^{(2)})/P$ | (51) |
| $Case_q = A$ | $t_2 = (2\pi q - \omega_{pmc}^{(2)})/Q$ | (52) |
| $Case_q = B$ | $t_2 = (2\pi(q-1) + \omega_{smc}^{(2)})/Q$ | (53) |

Optimization Method

Step 1

Some sets having fewer multipliers are selected from all the effective sets of interpolation factors as optimization objects (generally not more than 105% of the lowest number of multipliers. Calculation of the number of multipliers is carried out through the following formula:

$$\hat{N}_{mult} = (\hat{N}_a + \hat{N}_{ma2} + \hat{N}_{mc2})/2 + \lfloor(\hat{N}_{ma}+2)/2\rfloor + \lfloor(\hat{N}_{mc}+2)/2\rfloor + 3, \quad (54)$$

wherein $\hat{N}_a$, $\hat{N}_{ma2}$, $\hat{N}_{mc2}$, $\hat{N}_{ma}$ and $\hat{N}_{mc}$ are filter orders estimated for $H_a^{(2)}(z)$, $H_{ma}^{(2)}(z)$, $H_{mc}^{(2)}(z)$, $H_{ma}^{(1)}(z)$, and $H_{mc}^{(1)}(z)$, respectively, and wherein the orders may be obtained) by using the firpmord function in matlab.

Step 2

Each subfilter is designed according to the Parks-McClellan algorithm. As a matter of experience, after optimization, the order $N_a$ of $H_a^{(2)}(z)$ is equal to the estimated order $\hat{N}_a$, while the orders $N_{ma2}$, $N_{mc2}$, $N_{ma}$ and $N_{mc}$ of the masking filters are 60% of the respective estimated orders. When the order of a subfilter is not an integer, it is rounded. It should be noted that the order of the prototype filter and the orders of the second-stage masking filters must be even numbers, while the orders of the two first-stage masking filters are simultaneously odd numbers or even numbers.

Step 3

The subfilters are simultaneously optimized by using a nonlinear optimization algorithm. A vector Ø defined as a combination of parameters of the subfilters is as shown below:

$$\emptyset = \left[h_{ma}^{(1)}(0), \ldots, h_{ma}^{(1)}\left(\left\lfloor\frac{N_{ma}}{2}\right\rfloor\right), h_{mc}^{(1)}(0), \ldots, h_{mc}^{(1)}\left(\left\lfloor\frac{N_{mc}}{2}\right\rfloor\right),\right. \quad (55)$$

$$h_{ma}^{(2)}(0), \ldots, h_{ma}^{(2)}\left(\frac{N_{ma2}}{2}\right), h_{mc}^{(2)}(0), \ldots, h_{mc}^{(2)}\left(\frac{N_{mc2}}{2}\right),$$

$$\left.h_a^{(2)}(0), \ldots, h_a^{(2)}\left(\frac{N_a}{2}\right)\right].$$

To optimize the filter parameters, the following object function should be minimized:

$$E = \max_{\omega \in [0, \omega_p] \cup [\omega_s, \pi]} |W(\omega)[H(\emptyset, \omega) - D(\omega)]|, \quad (56)$$

wherein $H(\emptyset, \omega)$ is the zero phase frequency response of the system function $H(z)$;

$D(\omega)$ is an ideal zero phase frequency function; $W(\omega)$ is a weighted vector. For the passbands $\omega \in [0, \omega_p]$, $W(\omega)$ and $D(\omega)$ are equal to 1; for the stopbands $\omega \in [\omega_s, \pi]$, $W(\omega)$ is equal to $\delta_p/\delta_s$, and $D(\omega)$ is equal to 0.

This is a problem of minimization and maximization. The fminimax function in the optimization toolbox provided by MathWorks Company can solve this problem. To achieve more efficient optimization, non-uniform frequency points are employed; the closer to the regions of the passband edge and the stopband edge, the denser the frequency points. It is suggested that the frequency points within 10% region closest to the passband edge account for 25% of the total number of points, and it is the same as the stopband edge. During optimization using the fminimax function, the parameter requirements of a filter can be met only when E is not greater than $\delta_p$.

In order to find out the optimal solutions, for each set of interpolation factors, the order of each subfilter needs to be varied near the respective estimated order before optimization. As a matter of experience, the order of $H_a^{(2)}(z)$ is not varied, and variation is only required to be made to the order of each masking filter. For $N_{ma2}$, $N_{mc2}$, $N_{ma}$ and $N_{mc}$, a range of variation is 4; the variation of $N_{ma2}$ and $N_{mc2}$ is 2, while the variation of $N_{ma}$ and $N_{mc}$ is 1. After optimization, there may exist multiple solutions satisfying filter specifications, and the one having the fewest multipliers is selected as the optimal solution. In case of multiple optimal solutions, the one having the smallest time delay is selected.

Example 1

The specific specifications of a filter having an extremely narrow transition band are as follows: $\omega_p = 0.6\pi$, $\omega_s = 0.602\pi$, $\delta_p = 0.01$, $\delta_s = 0.01$. By using the present design method, the final results are as follows: $N_a = 28$, $N_{ma2} = 20$, $N_{mc2} = 16$, $N_{ma} = 17$, $N_{mc} = 29$. The three interpolation factors M, P, Q are 69,9,9, respectively, which fall into Case B type: $Case_p = B$, and $Case_q = B$. The number of multipliers is 59 with a group time delay being 1070.5. The passband and stopband ripples are 0.01 and 0.00999, respectively. Comparison of results of the method of the present invention with those of other existing methods is as shown in Table IX.

TABLE IX

Results of Designing Filter Using Various Methods in Example 1 And Comparison Thereof

| Method | Total Number Of Multipliers | Group Time Delay |
|---|---|---|
| Conventional two-stage FRM | 92 | 1105 |
| SFFM-FRM case A | 86 | 1638.5 |
| SFFM-FRM case B | 84 | 2150.5 |
| Serial-masking FRM | 83 | 1016 |
| Non-periodical FRM | 55 | 1214 |
| Improved method | 59 | 1070.5 |

As can be seen from Table IX, when compared with the conventional two-stage FRM, SFFM and serial-masking FRM methods, the method provided by the present invention is lower in complexity. When compared with the conventional two-stage FRM, the complexity is reduced by 35.8%; when compared with the SFFM-FRM, it is reduced by 31.4%; when compared with a serial-masking filter, it is reduced by 28.9%. When compared with the Non-periodical FRM, although the number of multipliers is increased by 7.3%, the group time delay is reduced by 11.8%. The time delay in the result of the present method is the smallest when compared with other methods apart from the Serial-masking FRM. Although the time delay is increased by 5.1% in contrast with the Serial-masking FRM, the number of multipliers is reduced by 28.9%.

The constraint conditions among the interpolation factors of a conventional FRM filter are broken through a new design method, and the subfilters are optimized simultaneously by means of a nonlinear joint optimization method. Results indicate that, as compared to a conventional design method of a two-stage FRM filter, a filter designed using the improved method is lower in complexity.

While the specific embodiments of the present invention are described above in conjunction with the accompanying drawings, they are not limitations to the protection scope of the present invention. It should be understood by those skilled in the relevant art that various modifications or variations made by those skilled in the art without creative work on the basis of the technical scheme of the present invention still fall into the protection range of the present invention.

The invention claimed is:

1. A method of constructing a two-stage FRM filter, comprising the following steps of:

determining, with a processor, a transfer function H(z) of a two-stage FRM filter as follows:

$H(z)=G(z)H_{ma}^{(1)}(z)+(1-G(z))H_{mc}^{(1)}(z)$, wherein $G(z)=H_a^{(2)}(z^M)H_{ma}^{(2)}(z^P)+(1-H_a^{(2)}(z^M))H_{mc}^{(2)}(z^Q)$, without any constraint among interpolation factors M, P, Q;

$H_a^{(2)}(z^M)$ represents a prototype filter, while $H_{ma}^{(1)}(z)$ and $H_{mc}^{(1)}(z)$ represent first-stage masking filters, respectively, and $H_{ma}^{(2)}(z^P)$ and $H_{mc}^{(2)}(z^Q)$ represent second-stage masking filters, respectively;

storing the interpolation factors M, P, Q in a memory;

searching, with a processor, within a search range for [M, P, Q], and for a certain set [M, P, Q], calculating passband and stopband edge parameters of the prototype filter $H_a^{(2)}(z)$, passband and stopband edge parameters of the second-stage masking filters and passband and stopband edge parameters of the first-stage masking filters in Case A and Case B, respectively, on the basis that a transition band of the whole filter is provided by $H_a^{(2)}(z^M)$ or a complement of $H_a^{(2)}(z^M)$;

calculating calculating, with a processor, the complexity of the FRM filter according to the calculated passband and stopband edge parameters, and finding out one or more sets [M, P, Q] having the lowest complexity within the search range;

optimizing, with a processor, an improved FRM filter according to the calculated filter parameters, by determining a number of multipliers implementing the improved FRM filter and a group time delay performed by the improved FRM filter, and constructing the improved FRM filter by arranging the multipliers, based on the calculated filter parameters.

2. The method of constructing a two-stage FRM filter according to claim 1, wherein a way of calculating the passband edge $\theta_a$ and the stopband edge $\varphi_a$ of the prototype filter $H_a^{(2)}(z^M)$ in the step (2) is as follows:

when the transition band of the whole filter is $H_a^{(2)}(z^M)$, i.e., in the Case A:

$m=\lfloor \omega_p M/2\pi \rfloor$, $\theta_a=\omega_p M-2m\pi$, $\varphi_a=\omega_s M-2m\pi$;

when the transition band of the whole filter is the complement of $H_a^{(2)}(z^M)$, i.e., in the Case B:

$m=\lceil \omega_s M/2\pi \rceil$, $\theta_a=2m\pi-\omega_s M$, $\varphi_a=2m\pi-\omega_p M$;

wherein $\lfloor x \rfloor$ represents a largest integer not more than x; $\lceil x \rceil$ represents a smallest integer not less than x; whether the result satisfies $0<\theta_a<\varphi_a<\pi$ is determined in the two cases respectively, and if not, the results are abandoned.

3. The method of constructing a two-stage FRM filter according to claim 1, wherein passbands of $H_a^{(2)}(M\omega)$ from 0 to $\pi$ in the step (2) are orderly represented by 0, 2, . . . , $$2\times\left\lfloor\frac{M}{2}\right\rfloor,$$

and passbands of $1-H_a^{(2)}(M\omega)$ from 0 to $\pi$ are orderly represented by 1, 3, . . . , $$2\times\left\lfloor\frac{M-1}{2}\right\rfloor;$$

assuming that the passband labeled as 2m of $H_a^{(2)}(M\omega)$ provides the transition band, the passband of the masking filter from which the transition band is extracted is defined as an effective passband; and in order to reduce the complexity of the two first-stage masking filters, the following restrictive conditions are established:

the passband 2m should be at least completely extracted;

the passband 2(m+1) should be completely fall outside an effective passband range.

4. The method of constructing a two-stage FRM filter according to claim 1, wherein when the transition band of the whole filter is provided by $H_a^{(2)}(z^M)$, i.e., in the Case A, a way of calculating the passband edge $\omega_{pma}^{(2)}$ and the stopband edge $\omega_{sma}^{(2)}$ of the second-stage masking filter $H_{ma}^{(2)}(z)$, is as follows:

(1) when masking is provided by $H_{ma}^{(2)}(z^P)$, the case is denoted as $Case_p=A$:

$$\begin{cases} \omega_{pma}^{(2)} = \max(2\pi p - \omega_1 P, \omega_2 P - 2\pi p) \\ \omega_{sma}^{(2)} = \omega_3 P - 2\pi p \end{cases};$$

(2) when masking is provided by the complement of $H_{ma}^{(2)}(z^P)$, the case is denoted as $Case_p=B$:

$$\begin{cases} \omega_{pma}^{(2)} = 2\pi p - \omega_3 P \\ \omega_{sma}^{(2)} = \min(\omega_1 P - 2\pi(p-1), 2\pi p - \omega_2 P) \end{cases};$$

wherein $\omega_1$ is a left edge of the passband 2m of the prototype filter, while $\omega_2$ is a right edge of the passband 2m of the prototype filter, and $\omega_3$ is a left edge of the passband 2(m+1) of the prototype filter; P is the interpolation factor, which is a given value; p is an integer, and should satisfy the following condition:

$$0 \le p \le \left\lfloor \frac{P}{2} \right\rfloor;$$

if no p satisfying the condition exists, the set of parameters is abandoned.

5. The method of constructing a two-stage FRM filter according to claim 1,
wherein when the transition band of the whole filter is provided by $H_a^{(2)}(z^M)$, i.e., in the Case A, a way of calculating the passband edge $\omega_{pmc}^{(2)}$ and the stopband edge $\omega_{smc}^{(2)}$ of the second-stage masking filter $H_{mc}^{(2)}(z)$ is as follows:
(1) when masking is provided by $H_{mc}^{(2)}(z^Q)$, the case is denoted as $Case_q=A$:

$$\begin{cases} \omega_{pmc}^{(2)} = \max(2\pi q - \omega_4 Q, \omega_5 Q - 2\pi q) \\ \omega_{smc}^{(2)} = \min(\omega_6 Q - 2\pi q, 2\pi(q+1) - \omega_7 Q) \end{cases};$$

(2) when masking is provided by the complement of $H_{mc}^{(2)}(z^Q)$, the case is denoted as $Case_q=B$:

$$\begin{cases} \omega_{pmc}^{(2)} = \max(2\pi q - \omega_6 Q, \omega_7 Q - 2\pi q) \\ \omega_{smc}^{(2)} = \min(\omega_4 Q - 2\pi(q-1), 2\pi q - \omega_5 Q) \end{cases};$$

wherein $\omega_4$ is a left passband edge of the complementary filter passband 2m−1 of the prototype filter; $\omega_5$ is a right stopband edge of the complementary filter passband 2m−1 of the prototype filter; $\omega_6$ is a left passband edge of the complementary filter passband 2m+1 of the prototype filter; $\omega_7$ is a right stopband edge of the complementary filter passband 2m+1 of the prototype filter;
q is an integer, and should satisfy the following condition:

$$0 \le q \le \left\lfloor \frac{q}{2} \right\rfloor;$$

if no q satisfying the condition exists, the set of parameters is abandoned.

6. The method of constructing a two-stage FRM filter according to claim 1,
wherein when the transition band of the whole filter is provided by the complement of $H_a^{(2)}(z^M)$, i.e., in the Case B, a way of calculating the passband edge $\omega_{pma}^{(2)}$ and the stopband edge $\omega_{sma}^{(2)}$ of the second-stage masking filter $H_{ma}^{(2)}(z)$ is as follows:
(1) when masking is provided by $H_{ma}^{(2)}(z^P)$, the case is denoted as $Case_p=A$:

$$\begin{cases} \omega_{pma}^{(2)} = \max(2\pi p - P\omega_4, \omega_5 P - 2\pi p) \\ \omega_{sma}^{(2)} = \min(\omega_6 P - 2\pi p, 2\pi(p+1) - \omega_7 P) \end{cases};$$

(2) when masking is provided by the complement of $H_{ma}^{(2)}(z^P)$, the case is denoted as $Case_p=B$:

$$\begin{cases} \omega_{pma}^{(2)} = \max(2\pi p - \omega_6 P, \omega_7 P - 2\pi p) \\ \omega_{sma}^{(2)} = \min(\omega_4 P - 2\pi(p-1), 2\pi p - \omega_5 P) \end{cases};$$

wherein $\omega_4$ is a left passband edge of the passband 2(m−1) of the prototype filter; $\omega_5$ is a right stopband edge of the passband 2(m−1) of the prototype filter; $\omega_6$ is a left passband edge of the passband 2m of the prototype filter; $\omega_7$ is a right stopband edge of the passband 2m of the prototype filter;
p is an integer, and should satisfy the following condition:

$$0 \le p \le \left\lfloor \frac{P}{2} \right\rfloor;$$

if no p satisfying the condition exists, the set of parameters is abandoned.

7. The method of constructing a two-stage FRM filter according to claim 1,
wherein when the transition band of the whole filter is provided by the complement of $H_a^{(2)}(z^M)$, i.e., the Case B, a way of calculating the passband edge $\omega_{pmc}^{(2)}$ and the stopband edge $\omega_{smc}^{(2)}$ of the second-stage masking filter $H_{mc}^{(2)}(z)$ is as follows:
(1) when masking is provided by $H_{mc}^{(2)}(z^Q)$, the case is denoted as $Case_q=A$:

$$\begin{cases} \omega_{pmc}^{(2)} = \max(2\pi q - \omega_1 Q, \omega_2 Q - 2\pi q) \\ \omega_{smc}^{(2)} = \omega_3 Q - 2\pi q \end{cases};$$

(2) when masking is provided by the complement of $H_{mc}^{(2)}(z^Q)$, the case is denoted as $Case_q=B$:

$$\begin{cases} \omega_{pmc}^{(2)} = 2\pi q - \omega_3 Q \\ \omega_{smc}^{(2)} = \min(\omega_1 Q - 2\pi(q-1), 2\pi q - \omega_2 Q) \end{cases};$$

wherein $\omega_1$ is a left stopband edge of the complementary filter passband 2m−1 of the prototype filter; $\omega_2$ is a right passband edge of the complementary filter passband 2m−1 of the prototype filter; $\omega_3$ is a left stopband edge of the complementary filter passband 2m+1 of the prototype filter;
q is an integer, and should satisfy the following condition:

$$0 \le q \le \left\lfloor \frac{q}{2} \right\rfloor;$$

if no q satisfying the condition exists, the set of parameters is abandoned.

8. The method of constructing a two-stage FRM filter according to claim 1,
wherein when the transition band of the whole filter is provided by $H_a^{(2)}(z^M)$, i.e., in the Case A:
the passband edge $\omega_{pma}^{(1)}$ of the first-stage masking filter $H_{ma}^{(1)}(z)$ is equal to $\omega_p$;

a way of calculating the stopband edge $\omega_{sma}^{(1)}$ of the first-stage masking filter $H_{ma}^{(1)}(z)$ is as follows:

$$\omega_{sma}^{(1)} = \min(\omega_{sma\_temp1}^{(1)}, \omega_{sma\_temp2}^{(1)}),$$

wherein $$\omega_{sma\_temp1}^{(1)} = \begin{cases} t_1 & t_1 \notin R_{stop}(k) \\ \omega_8 & t_1 \in R_{stop}(k_1) \end{cases},$$

$$\omega_{sma\_temp2}^{(1)} = \begin{cases} t_2 & t_2 \notin R_{pass}(k) \\ \omega_9 & t_2 \in R_{pass}(k_2) \end{cases},$$

$\omega_8 = (2\pi k_1 = \varphi_a)/M; \omega_9 = (2\pi k_2 - \theta_a)/M;$ $$R_{pass}(k) = \left[\frac{2\pi k - \theta_a}{M}, \frac{2\pi k + \theta_a}{M}\right], k = 0, \ldots, \lfloor M/2 \rfloor;$$

$$R_{stop}(k) = \left[\frac{2\pi(k-1) + \varphi_a}{M}, \frac{2\pi k + \varphi_a}{M}\right], k = 0, \ldots, \lfloor M/2 \rfloor;$$

(1) when $H_{ma}^{(2)}(z^P)$ is used for masking unnecessary band of an up-branch, $t_1 = (2\pi(p+1) - \omega_{sma}^{(2)})/P;$ (2) when the complement of $H_{ma}^{(2)}(z^P)$ is used for masking the unnecessary band of the up-branch, $t_1 = (2\pi p + \omega_{pma}^{(2)})/P;$ (3) when $H_{mc}^{(2)}(Z^Q)$ is used for masking unnecessary band of a down-branch, $t_2 = (2\pi(q+1) - \omega_{smc}^{(2)})/Q;$ (4) when a down-branch complement $H_{mc}^{(2)}(Z^Q)$ is used for masking unnecessary band, $t_2 = (2\pi q + \omega_{pmc}^{(2)})/Q;$ wherein P, Q, M are interpolation factors; $\omega_8$ is a right endpoint of $R_{stop}(k_1)$; $k_1$ is an integer satisfying $t_1 \in R_{stop}(k_1)$; $\omega_9$ is a right endpoint of $R_{pass}(k_2)$; $k_2$ is an integer satisfying $t_2 \in R_{stop}(k_2)$; $\theta_a$ is a passband edge of $H_a^{(2)}(z)$; $H_{ma}^{(1)}(z)\varphi_a$ is a stopband edge of $H_a^{(2)}(z)$.

9. The method of constructing a two-stage FRM filter according to claim 1,
wherein when the transition band of the whole filter is provided by the complement of $H_a^{(2)}(z^M)$, i.e., in the Case B:
the passband edge $\omega_{pma}^{(1)}$ of the first-stage masking filter $H_{ma}^{(1)}(z)$ is equal to $\omega_p$;
a way of calculating the stopband edge $\omega_{sma}^{(1)}$ of the first-stage masking filter $H_{ma}^{(1)}(z)$ is as follows:

$$\omega_{sma}^{(1)} = \min(\omega_{sma\_temp1}^{(1)}, \omega_{sma\_temp2}^{(1)}),$$

wherein $$\omega_{sma\_temp1}^{(1)} = \begin{cases} t_1 & t_1 \notin R_{stop}(k) \\ \omega_8 & t_1 \in R_{stop}(k_1) \end{cases},$$

$$\omega_{sma\_temp2}^{(1)} = \begin{cases} t_2 & t_2 \notin R_{pass}(k) \\ \omega_9 & t_2 \in R_{pass}(k_2) \end{cases},$$

$\omega_8 = (2\pi k_1 = \theta_a)/M; \omega_9 = (2\pi k_2 - \varphi_a)/M;$ $$R_{pass}(k) = \left[\frac{2\pi k - \theta_a}{M}, \frac{2\pi k + \theta_a}{M}\right], k = 0, \ldots, \lfloor M/2 \rfloor;$$

$$R_{stop}(k) = \left[\frac{2\pi(k-1) + \varphi_a}{M}, \frac{2\pi k + \varphi_a}{M}\right], k = 0, \ldots, \lfloor M/2 \rfloor;$$

(1) when $H_{mc}^{(2)}(z^Q)$ is used for masking unnecessary band, $t_1 = (2\pi(q+1) - \omega_{smc}^{(2)})/Q;$ (2) when the complement of $H_{mc}^{(2)}(z^Q)$ is used for masking unnecessary band, $t_1 = (2\pi q + \omega_{pmc}^{(2)})/Q;$ (3) when $H_{ma}^{(2)}(z^P)$ is used for masking unnecessary band, $t_2 = (2\pi(p+1) - \omega_{sma}^{(2)})/P;$ (4) when the complement of $H_{ma}^{(2)}(z^P)$ is used for masking unnecessary band, $t_2 = (2\pi p + \omega_{pma}^{(2)})/P;$ wherein $\omega_8$ is a right endpoint of $R_{stop}(k_1)$; $k_1$ is an integer satisfying $t_1 \in R_{stop}(k_1)$; $\omega_9$ is a right endpoint of $R_{pass}(k_2)$; $k_2$ is an integer satisfying $t_2 \in R_{stop}(k_2)$; P, Q, M are interpolation factors; $\theta_a$ is a passband edge of $H_a^{(2)}(z)$; $H_{ma}^{(1)}(z)\varphi_a$ is a stopband edge of $H_a^{(2)}(z)$.

10. The method of constructing a two-stage FRM filter according to claim 1,
wherein (1) when the transition band of the whole filter is provided by $H_a^{(2)}(z^M)$, i.e., in the Case A: the stopband edge $\omega_{smc}^{(1)}$ of the first-stage masking filter $H_{mc}^{(1)}(z)$ is equal to $\omega_s$;
a way of determining the passband edge $\omega_{pmc}^{(1)}$ of the first-stage masking filter is as follows:
if $t_3 \geq t_4$, then $$\omega_{pmc}^{(1)} = \begin{cases} t_3 & t_3 \notin R_{stop}(k) \\ \max\left(\frac{2\pi(k_3-1)+\varphi_a}{M}, t_4\right) & t_3 \in R_{stop}(k_3) \end{cases};$$

if $t_3 < t_4$, then $$\omega_{pmc}^{(1)} = \begin{cases} t_4 & t_4 \notin R_{pass}(k) \\ \max\left(\frac{2\pi k_4 - \theta_a}{M}, t_3\right) & t_4 \in R_{pass}(k_4) \end{cases};$$

(a) when $H_{ma}^{(2)}(z^P)$ is used for masking unnecessary band, $t_3 = (2\pi p - \omega_{pma}^{(2)})/P;$ (b) when the complement of $H_{ma}^{(2)}(z^P)$ is used for masking the unnecessary band, $t_3 = (2\pi(p-1) + \omega_{sma}^{(2)})/P;$ (c) when $H_{mc}^{(2)}(z^Q)$ is used for masking unnecessary band, $t_4 = (2\pi q - \omega_{pmc}^{(2)})/Q;$ (d) when the complement $H_{mc}^{(2)}(z^Q)$ is used for masking unnecessary band, $t_4 = (2\pi(q-1) + \omega_{smc}^{(2)})/Q;$ (2) when the transition band of the whole filter is provided by the complement of $H_a^{(2)}(z^M)$, i.e., in the Case B: the stopband edge $\omega_{smc}^{(1)}$ of the first-stage masking filter $H_{mc}^{(1)}(z)$ is equal to $\omega_s$;
a way of determining the passband edge $\omega_{pmc}^{(1)}$ of the first-stage masking filter $H_{mc}^{(1)}(z)$ is as follows:

if $t_3 \geq t_4$, then $$\omega_{pmc}^{(1)} = \begin{cases} t_3 & t_3 \notin R_{stop}(k) \\ \max\left(\frac{2\pi(k_3-1)+\varphi_a}{M}, t_4\right) & t_3 \in R_{stop}(k_3) \end{cases};$$

if $t_3 < t_4$, then $$\omega_{pmc}^{(1)} = \begin{cases} t_4 & t_4 \notin R_{pass}(k) \\ \max\left(\frac{2\pi k_4 - \theta_a}{M}, t_3\right) & t_4 \in R_{pass}(k_4) \end{cases};$$

(a) when $H_{mc}^{(2)}(z^Q)$ is used for masking unnecessary band, $t_3 = (2\pi(q-1)+\omega_{smc}^{(2)})/Q;$ (b) when the complement of $H_{mc}^{(2)}(z^Q)$ is used for masking the unnecessary band, $t_3 = (2\pi(q-1)+\omega_{smc}^{(2)})/Q;$ (c) when $H_{ma}^{(2)}(z^P)$ is used for masking unnecessary band, (d) when the complement $H_{ma}^{(2)}(z^P)$ is used for masking unnecessary band, $t_4 = (2\pi(p-1)+\omega_{sma}^{(2)})/P;$ wherein $t_3$ and $t_4$ are left passband edges of the passband including the transition band and a first passband on the left of the transition band, respectively; $k_3$ is an integer satisfying $t_3 \in R_{stop}(k_3)$; $k_4$ is an integer satisfying $t_4 \in R_{pass}(k_4)$; P, Q, M are interpolation factors; $\theta_a$ is a passband edge of $H_a^{(2)}(z)$; $H_{ma}^{(1)}(z)\varphi_a$ is a stopband edge of $H_a^{(2)}(z)$.

* * * * *